(12) United States Patent
Küpper et al.

(10) Patent No.: US 7,965,043 B2
(45) Date of Patent: Jun. 21, 2011

(54) INNER COATING OF LAMP VESSELS, SUCH AS DISCHARGE VESSELS OF GAS DISCHARGE LAMPS

(75) Inventors: Thomas Küpper, Bad Gandersheim (DE); Margareta Hamel, Ebergötzen (DE); Christoph Mölle, Bad Gandersheim (DE); Dietmar Ehrlichmann, Berlin (DE); Rainer Kronfoth, Berlin (DE); Klaus Günther, Neu Lutterow (DE)

(73) Assignee: Auer Lighting GmbH (DE)

( * ) Notice: Subject to any disclaimer, the term of this patent is extended or adjusted under 35 U.S.C. 154(b) by 261 days.

(21) Appl. No.: 11/720,914

(22) PCT Filed: Dec. 19, 2005

(86) PCT No.: PCT/EP2005/013643
§ 371 (c)(1),
(2), (4) Date: Feb. 4, 2009

(87) PCT Pub. No.: WO2006/063854
PCT Pub. Date: Jun. 22, 2006

(65) Prior Publication Data
US 2009/0140628 A1    Jun. 4, 2009

(30) Foreign Application Priority Data

Dec. 17, 2004  (DE) .................. 10 2004 061 632

(51) Int. Cl.
*H01J 1/62* (2006.01)
*H05B 31/04* (2006.01)
*H01J 17/20* (2006.01)

(52) U.S. Cl. ........ 313/635; 313/485; 313/489; 313/580; 313/25; 313/637; 313/638

(58) Field of Classification Search ........................ None
See application file for complete search history.

(56) References Cited

U.S. PATENT DOCUMENTS

| 4,345,180 A | 8/1982 | Schneider et al. |
| 4,574,218 A | 3/1986 | Bateman, Jr. et al. |
| 5,944,964 A * | 8/1999 | Solberg et al. ........... 204/192.26 |
| 6,685,994 B1 * | 2/2004 | Karner et al. ................. 427/569 |
| 2001/0055930 A1 | 12/2001 | Ott et al. |
| 2003/0102805 A1 | 6/2003 | Hataoka et al. |

(Continued)

FOREIGN PATENT DOCUMENTS

DE    42 08 376 A1    9/1993

(Continued)

OTHER PUBLICATIONS

Das et al., "Intrinsic hydrogenated microcrystalline silicon oxide films prepared by RF glow discharge" Journal of Materials Science Letters, 1998, pp. 2097-2099.*

(Continued)

*Primary Examiner* — Anne M Hines
*Assistant Examiner* — Tracie Green
(74) *Attorney, Agent, or Firm* — DeMont & Breyer LLC

(57) ABSTRACT

The invention relates to a discharge vessel of a quartz glass for discharge lamps with a diffusion barrier inner layer of silicon oxide, which as a single layer is applied and/or is generated on the inner surface as well as to a method for generating and/or applying such a diffusion barrier inner layer and to the use of such a discharge vessel.

24 Claims, 2 Drawing Sheets

U.S. PATENT DOCUMENTS

2004/0106285 A1* 6/2004 Zacharias ................ 438/689
2006/0211267 A1* 9/2006 Joshi et al. ................ 438/778

FOREIGN PATENT DOCUMENTS

EP   0 501 562 A1   9/1992
EP   1 084 996 A1   3/2001

OTHER PUBLICATIONS

International Preliminary Examination Report.
Xiaodong Wang, "Chinese Application No. 200580043220.1 First Office Action", Jun. 19, 2009, Publisher: The Patent Office of the People's Republic of China, Published in: CN.

* cited by examiner

INNER COATING OF LAMP VESSELS, SUCH AS DISCHARGE VESSELS OF GAS DISCHARGE LAMPS

The invention relates to a lamp vessel, in particular a discharge vessel of quartz glass for discharge lamps, having a diffusion barrier inner layer, as well as to a method for generating a diffusion barrier inner layer and to the use of such a lamp vessel, for instance a discharge vessel produced in this way.

As is known, quartz glass or aluminum oxide is available as a vessel material for the burners of high-pressure discharge lamps.

In this case, above all, the protective function of the discharge vessel material for a constant gas discharge process and therefore the longterm stability of the lamp must be taken into account. The discharge vessel with the enclosed discharge space, the electrodes and the filling will also be referred to as a burner.

Essential processes, which limit the lifetime of such burners, are the diffusion of filling constituents from the discharge space into or even through the vessel wall. The composition of the filling determines both the luminous efficiency and the color locus of the discharge, which is correspondingly shifted when the composition of the filling changes owing to diffusion of individual constituents.

These color shifts are detrimental for several reasons: For example, lamps in the automotive field must fulfill legislative requirements of the color locus throughout the lifetime. Even the smallest color drift is therefore of great importance for a long lamp lifetime. Furthermore, when the individual headlamp bulbs are changed, no perceptible color differences should occur between the right and left headlamps due to different burning times.

One example of this is the diffusion of sodium as a filling constituent into the quartz glass of a discharge vessel during the lifetime. The mobility of sodium ions is such that quartz glass, i.e. vitreous amorphous silicon dioxide ($SiO_2$) is relatively porous for sodium. The strength of this diffusion process depends inter alia strongly on the solubility and mobility of sodium in the discharge vessel glass. The diffusion rate of sodium ions through vitreous silicon dioxide follows an exponential function of temperature.

The loss of sodium in the burner space reduces the relative radiation component of sodium in the overall radiation. Since sodium emits predominantly in the yellow range, the color temperature of the lamp is shifted to higher color temperatures (into blue).

Another process during the lamp lifetime, in the case of fillings with scandium as a constituent, is the formation of scandium silicate. Little is yet known about the rate and extent of these reactions. This can, however, be qualitatively detected well and leads to a loss of scandium available for the discharge and therefore likewise to color shifts.

An example of a corresponding discharge lamp is given by US 2003/0189408 A1. Sodium (Na), scandium (Sc) and zinc (Zn) are mentioned besides xenon (Xe) as gas filling constituents for mercury-free HID lamps, which are respectively added as sodium iodide, scandium iodide and zinc iodide to a xenon gas filling.

Furthermore, it should be mentioned that the devitrification of a quartz glass discharge vessel is also a lifetime-limiting factor. The filling of the lamp has a devitrification-promoting effect in this case since it contains Na, Sc and, in the case of mercury-free lamps, also Zn. Passivation of the quartz surface against attack by the filling is therefore suitable in order to retard devitrification processes.

Passivation is furthermore useful in order to stabilize cycle processes in high-pressure lamps, since plasma-wall interactions can lead to the undesired release or absorption of hydrogen and oxygen into and from the discharge volume.

The choice of polycrystalline translucent aluminum oxide ($Al_2O_3$) as a burner material is very cost-intensive compared with quartz glass, requires additional design adaptations of the burner geometry owing to different material properties and leads to a loss of luminance owing to the lack of transparency.

In order to be able to utilize the advantages of quartz glass as a substrate material for discharge vessels, various attempts have been made to increase the lifetime of discharge vessels with quartz glass burners according to respectively existing requirements.

For instance, DE 42 08 376 proposes protective layers inter alia of $SiO_2$ or $Al_2O_3$ on the quartz glass against corrosion and erosion due to the constant bombardment by electrons and ions, which are caused by the microdischarges in the discharge space and attack the discharge vessel wall. The protective layer applied in this case is intended to prevent the bond cleavages ("erosion") caused in the glass by electron bombardment.

DE 41 15 437 discloses a protective layer of $SiO_2$ or $Al_2O_3$ on the glass of a cathode ray tube, which is intended to prevent a brown coloration of the glass that occurs owing to electron bombardment as a result of a direct chemical reaction between the glass surface and an applied multilayer interference filter.

In these two cases, the protective layer acts as a buffer layer against bombardment by particles, although it gives no solution for the problem of gas filling constituents diffusing out of the discharge space. To this end, barrier coatings of $Al_2O_3$, quartz glass or $Al_2O_3$ are proposed as a substrate material for discharge vessels.

For instance, DE 102 16 092 describes a barrier coating of aluminum oxide on that surface of the discharge vessel made of quartz glass which faces the discharge space. This barrier layer is intended to form a barrier against diffusion of Na into the quartz glass and protect the latter against halogen attacks. For coating by means of a plasma-assisted CVD method, preferably a PICVD method, aluminum chloride ($AlCl_3$) in an atmosphere of $O_2$ is proposed as a precursor gas (CVD=Chemical Vapor Deposition, PICVD=Plasma Impulse Chemical Vapor Deposition).

The disadvantage with this, above all, is a very high and cost-intensive outlay for upgrading a PICVD coating apparatus which in its basic capacity is operated with silicon- and titanium-containing precursor gases such as hexamethyl disiloxane and titanium chloride.

DE 20 23 772 also describes a quartz glass coated on the inside with a protective layer of aluminum oxide as a substrate material for a discharge vessel, as an alternative to the use of polycrystalline aluminum oxide.

DE 25 24 410 discloses a discharge vessel made of vitreous silicon dioxide which comprises a zone, into which aluminum oxide has diffused, on its outer side facing away from the discharge space. This zone is intended to serve as an Na diffusion barrier.

It is an object of the invention to specify an economical alternative to a diffusion barrier coating of a lamp vessel, for instance a quartz glass discharge vessel comprising $Al_2O_3$, and to provide a lamp vessel, for instance a discharge vessel of quartz glass, which leads to an extended lifetime of the lamp owing to at least retarded diffusion of gas constituents of the discharge gas filling.

This object is achieved according to the invention by the features specified in the main body of claim 1. Preferred embodiments and refinements of the invention can be found in the respective dependent claims.

Accordingly, the invention provides a method for producing a lamp vessel of transparent material, preferably a discharge vessel of quartz glass for discharge lamps with a diffusion barrier inner layer, in which a diffusion barrier inner layer which consists of silicon oxide and is applied by a CVD method on the inner wall of the lamp vessel, preferably of the discharge vessel, is applied as a single layer.

The invention thus proposes to form a diffusion barrier of $SiO_2$ on the interface of a lamp vessel, in particular a quartz glass substrate of a discharge vessel, with the discharge space. Besides for coating gas discharge vessels of gas discharge lamps, preferably of quartz glass, the invention may also be used in general for lamp vessels of transparent material.

Diffusion barrier coatings, such as are proposed according to the invention, may therefore also be used inter alia for lamp vessels of incandescent lamps. In particular for halogen lamps as well, a diffusion barrier proves expedient in order to increase the lifetime of such lamps. For example, it is also envisageable to significantly increase the lifetime of halogen lamps for the automotive field, such as H1, H4 or H7 lamps. Besides quartz glass vessels or vessels containing quartz glass, it is furthermore possible to coat lamp vessels which comprise a hard glass, in particular an aluminosilicate glass, borosilicate glass or aluminoborosilicate glass, or which consist of such a glass. Furthermore, advantageous coating of lamp vessels made of or comprising ceramic material is also conceivable.

It has been found that microcrystalline or sub-microcrystalline $SiO_2$ has a diffusion-inhibiting effect with respect to constituents of the filling of a burner or an incandescent lamp. In this case both a mixture of microcrystalline $SiO_2$ and sub-microcrystalline $SiO_2$ and, for example, a narrow crystallite size distribution lie within the scope of the invention.

A typical configuration of the invention is a crystallite size of less than 50 nm. Preferred crystallite size distributions lie in the range of less than 10 nm. The crystallite sizes may even have a size of less than 2 nm. In this case, the crystallites are of the order of magnitude of only a few unit cells. The mobility of filling constituents in the diffusion barrier layer then decreases with the degree of order of the individual $SiO_2$ molecules.

The microcrystalline structure and the rather thin layer of microcrystalline $SiO_2$ in this case simultaneously ensure preservation of the transparency of the vessel substrate, for example of a discharge vessel substrate.

A particularly economical method for applying such a diffusion barrier layer of microcrystalline and/or sub-microcrystalline $SiO_2$ is the CVD method. Reactive coating methods are preferred here, such as PICVD (Plasma-Impulse-Chemical-Vapor-Deposition)

PECVD (Plasma-Enhanced-Chemical-Vapor-Deposition)
PACVD (Plasma-Assisted-Chemical-Vapor-Deposition) and
TCVD (Thermal-Chemical-Vapor-Deposition)

The PICVD method, in particular, is suitable for producing the coating according to the invention. Here, the layer growth and the crystallization of the $SiO_2$ can be controlled expediently via the coating parameters. Coating parameters for influencing the morphology of the growing layers are, in particular, the temperature in the reaction space and on the coating surface, the microwave power density and the partial pressure of the precursor (precursor component in the gas volume) and therefore the concentration of Si in the reaction space.

An essential factor in this case is the temperature of the substrate before the start of the coating process. Before the start of the coating, the substrate must already be hot enough so that the growing layer can bond firmly to the substructure. If this is not the case, then the arriving Si constituents grow firmly only on one another and do not bond firmly enough to the substrate, so that only a dust-like pulverulent coat is obtained on the substrate.

If the substrate temperature is higher from the start, then although the arriving Si constituents grow firmly enough on the substrate, it does not however necessarily mean that the resulting structure must also be optically transparent. Rather, tests have shown that this requires a certain minimum temperature of the substrate, which in turn depends on the type and geometry of the substrate. Beyond a particular temperature range, the layers grow in an optically glass-clear fashion, while they appear milky-turbid with lower initial temperatures.

The cause of the milky appearance with low coating temperatures is layer growth in the form of pronounced column growth. The boundaries between the crystallites preferentially growing in a columnar fashion are in this case optically active and cause strong scattering of the light passing through, which leads to the milky-turbid appearance. With high substrate temperatures, this column growth is at least less strongly pronounced or even entirely suppressed, so that with high temperatures these scattering centers no longer occur and the turbid appearance can therefore be suppressed.

Just as important as a sufficiently high substrate temperature at the start of the coating process, is maintaining this temperature during the coating process. In particular, it is necessary to ensure that the substrate temperature initially achieved can also be maintained during the prolonged coating process by appropriate selection of the process parameters, so that the growth conditions of the layers do not change during the coating process.

The most essential influencing quantity in the PICVD method for adjusting the temperature is the microwave power density in the reaction space. This depends in turn essentially on the size and shape of the reaction space as well as on the type of coupling of the microwave power.

The required microwave power can be adjusted by suitable selection of the pulse amplitude and the ratio of pulse length to pulse pause. By correspondingly selected microwave parameters, optically glass-clear coatings on reflectors can therefore be achieved during the coating.

It is furthermore important to adjust the gas flow in proportion to the microwave power density, so that the precursor gas introduced reacts fully, since otherwise milky-turbid layers may also be created.

In order to achieve a high diffusion barrier effect of the layer, for example against sodium ions, it is necessary to apply the coating at particularly high temperatures since the layers are commensurately denser, and therefore commensurately less permeable for diffusing sodium ions, the higher the temperatures are when growing the layers. Here again it is important to suppress the column structures otherwise occurring at lower temperatures, since this morphology, besides the optically undesired scattering centers which lead to a milky-turbid appearance, is also very unfavorable in respect of the diffusion of sodium ions. The diffusion of ions in a crystal lattice generally takes place preferentially along the edges of the crystals (so-called grain boundary diffusion), which, in the case of growing columns whose preferential direction is oriented precisely in the direction through the layer, is particularly unfavorable for the intended function of a diffusion barrier effect.

The object of the barrier layer according to the invention is therefore an effective diffusion barrier layer against ion diffusion, wherein the crystallites are microcrystalline and/or sub-microcrystalline.

Another advantage of the diffusion barrier layer according to the invention made of microcrystalline and/or sub-microcrystalline $SiO_2$ on quartz glass is a very high affinity of the applied ions for the substrate material and therefore outstanding adhesion of the layer on the substrate, even at very high temperatures. A particular advantage in this case is that the diffusion barrier layer is made from virtually the same material as the substrate. Since the thermal expansion coefficient is therefore the same for both materials, no cracking or only very minor cracking is to be expected at high temperatures.

Typical layer thicknesses for a coating of microcrystalline and/or sub-microcrystalline $SiO_2$ are from 10 to 1000 nm, preferably from 50 to 500 nm. The maximal crystallite size can be influenced via the selected layer thickness.

In a refinement of the invention, the microcrystalline and/or sub-microcrystalline $SiO_2$ diffusion barrier layer is not applied by coating the inner surface of the quartz glass substrate, but is formed in the interfacial zone of the quartz glass substrate of the lamp vessel, for instance a discharge vessel, with the vessel interior i.e. with the discharge space of a gas discharge lamp. This is done by means of a heat treatment of the vessel in a surface, for example the discharge vessel inner surface of gas discharge lamps.

In a preferred embodiment of the method, this heat treatment is introduction of heat by a plasma discharge. A preferred method for this is the CVD method, such as PICVD (Plasma-Impulse-Chemical-Vapor-Deposition)
PECVD (Plasma-Enhanced-Chemical-Vapor-Deposition)
PACVD (Plasma-Assisted-Chemical-Vapor-Deposition) and
TCVD (Thermal-Chemical-Vapor-Deposition)

When using the PICVD method, this input of heat into the inner surface zone of the quartz glass substrate can be controlled expediently. Here again, a microcrystalline and/or sub-microcrystalline crystal structure is generated in the $SiO_2$ of the inner surface zone. In this case as well, a diffusion-inhibiting effect for constituents of the burner filling is observed.

In the PICVD method, it is particularly recommendable to carry out the heat treatment of the surface by a plasma treatment by means of a reactive gas, preferably a reactive etching gas such as for example oxygen and/or sulfur hexafluoride, in which case the excitation of the plasma and therefore the efficiency of the etching gas can be expediently adjusted by selection of the microwave process parameters. Here again, the crucial parameter is the microwave power density, which can be adjusted via the pulse amplitude and via the ratio of pulse length to pulse pause. By the etching process of the very reactive gas at high temperatures, the quartz glass layer can be made to crystallize at least partially in a thin zone, which generates a thin microcrystalline and/or sub-microcrystalline layer that has an increased blocking effect against diffusion of gas atoms out of the gas volume.

Another preferred embodiment of the invention is a combination of the two differently produced diffusion barrier layers, as respectively described above. First, a microcrystalline and/or sub-microcrystalline crystal structure is generated in the $SiO_2$ of the inner surface zone of the quartz glass substrate, preferably by means of heat input by a plasma discharge, for example with the aid of an etching gas. A further microcrystalline and/or sub-microcrystalline $SiO_2$ layer is subsequently applied onto this layer by means of a CVD method.

An advantage of this combination of the two differently produced diffusion barrier layers is that the micro- or sub-microcrystalline crystal structure produced first constitutes a suitable undercoat for the second diffusion barrier layer applied by a CVD process. In particular, besides possible differences in the chemical composition, the two micro- or sub-microcrystalline layers produced in different ways will differ particularly in their average crystallite size, their crystallite size distribution and their preferential orientation of the crystallites (morphology).

(Possible difference in the chemical composition pertains to residues from the precursor gas of the $SiO_2$ coating in the diffusion barrier inner layer applied onto the quartz glass substrate. Such residues are likely to reinforce the diffusion-inhibiting effect of the inner coating according to the invention. An organic silicon compound, preferably hexamethyl disiloxane, is used as a precursor gas.)

For example, it may be that the heat input by means of a plasma discharge, for example with the aid of an etching gas, leads to a very fine-grained crystallite size distribution in the range <10 nm in a very thin zone, while the average crystallite size distribution is very much greater during the growth of a coating by means of a CVD process, for example a PICVD process, for example 10-500 nm, since the resulting crystallite sizes are very often of the order of magnitude of the applied layer thickness.

It has furthermore been observed that when an SiO2 layer is applied onto glass or quartz glass with the aid of a CVD method, in particular with a PICVD method, the resulting crystallites preferentially grow in a columnar fashion. The expression of this preferential growth form can be reduced if the surface is at a very high temperature during the coating process, and/or if it has been suitably treated beforehand.

This suitable treatment may for example be a superficial crystallization of the quartz glass, so that a free interface between amorphous quartz glass and a growing SiO2 layer is no longer present during the growth by means of the CVD coating process. Owing to the interaction between the crystalline surface and the gas condensing from the CVD process, the constituents can no longer grow in the otherwise preferential column structure. The cause of this may be that the growing crystals are in this case compelled to be oriented along the orientation of the crystallites already present, and they can no longer adopt their otherwise preferential growth form of a layer structured in columnar fashion.

It may therefore be advantageous first to generate a sub-microcrystalline layer by a suitable heat treatment on the quartz glass bulb, for example with the aid of an etching gas, and only then to apply a microcrystalline coating by a CVD coating process.

This combined method can be made particularly economical in the same apparatus, to which end an apparatus for coating by means of a PICVD method is particularly well suited. For a PICVD coating apparatus, which is configured for coating substrates inter alia by means of silicon-containing precursor gases such as hexamethyl disiloxane, it is readily possible without great refitting to introduce a further gas species for an etching process, for example oxygen or sulfur hexafluoride, as is needed for example for heat treating the quartz glass surface by a plasma treatment by means of a reactive etching gas in order for a diffusion barrier layer to be produced according to the invention. The method according to the invention can avoid expensive and elaborate refitting of the apparatus. Hexamethyl disiloxane is very well suited as a precursor gas for coating a burner inner surface according to the invention with a diffusion barrier layer.

Such discharge vessels produced according to the invention may be employed as metal halide lamps. In this context, the following are to be mentioned in particular:

High-pressure metal halide lamps with and without addition of mercury for motor vehicle headlamps, so-called "xenon light" with a typical xenon cold fill pressure of between 5-15 bar.

High-pressure metal halide lamps for general lighting.

High-pressure metal halide lamps for projection tasks.

Ultrahigh-pressure mercury lamps for projection applications, which use a halogen cycle process.

The invention will be explained in more detail by way of example with the aid of the drawing, in which.

Figure 1:
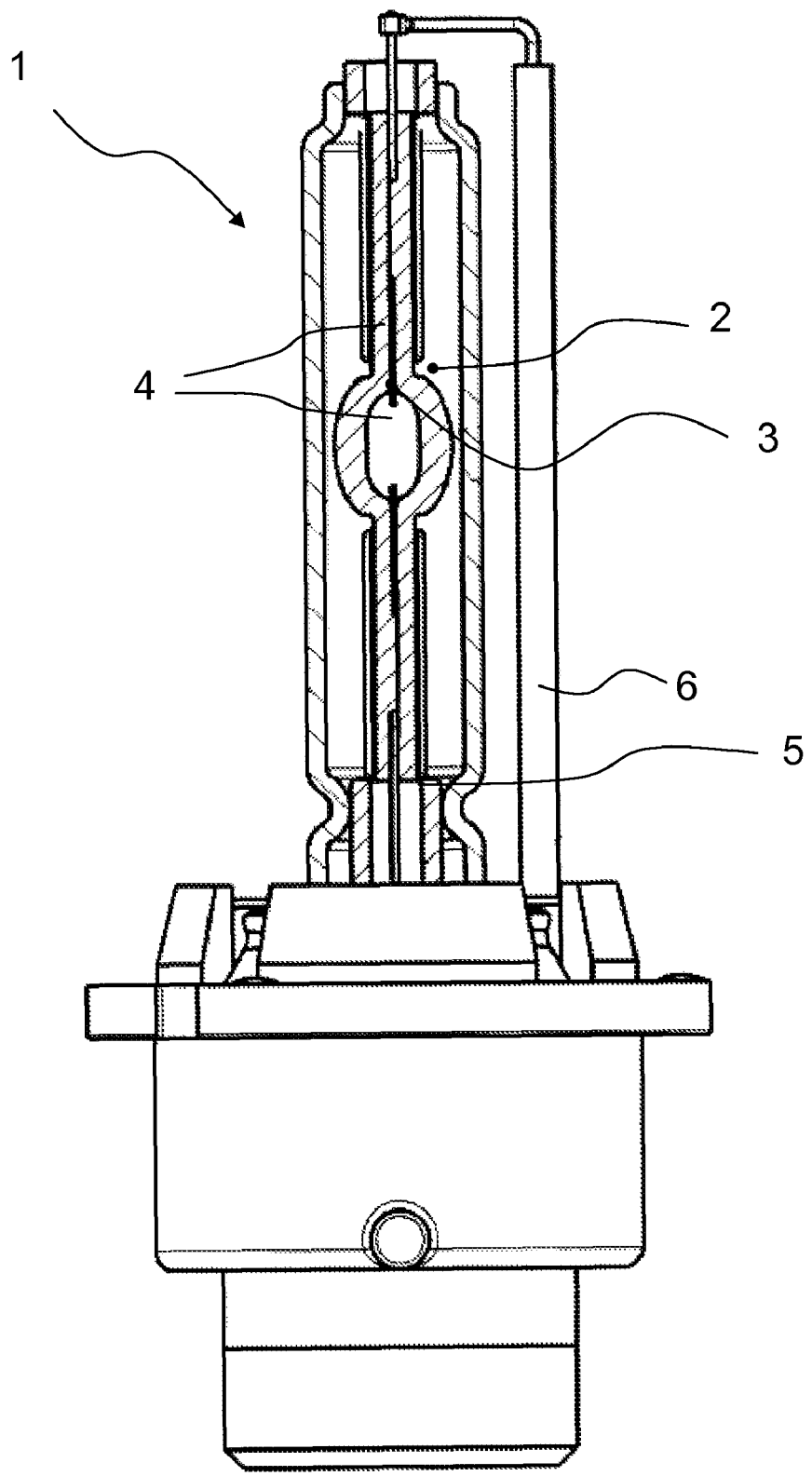
FIG. 1 shows a metal halide lamp (D lamp), as is used for example for motor vehicles.

FIG. 1 shows the detail of a short-arc xenon lamp 1. The discharge space 3 is filled with xenon as a discharge gas, optionally also with further gas constituents such as sodium iodide, scandium iodide and zinc iodide. In order to operate the discharge, tungsten electrodes 4 are introduced in a gastight fashion via sealing foils in the quartz glass discharge vessel 2. A base with an electrical connection 5 and a shaft 6 with an electrical feed form components of the electricity supply.

An exemplary embodiment of such a D lamp with a gas filling respectively as a mercury-containing and mercury-free version and an inventive inner coating of the quartz glass discharge vessel 2 is given by the following table.

|  | D2 (containing mercury) | D4 (mercury-free) | Comment |
| --- | --- | --- | --- |
| Burning voltage (V) | 85 | 42 | Rated value |
| Power (W) | 35 | 35 | Rated value |
| Electrode spacing (mm) | 4.2 | 4.2 | Rated value |
| Xenon cold fill pressure (bar) | 8 | 10 to 15 | Typical values |
| Hg quantity (mg) | 0.5 | 0 | Typical values |
| Metal halide (mg) | 0.3 | 0.4 | Typical values |
| of which NaI | 70% | 55% | Typical values |
| of which ScI3 | 30% | 25% | Typical values |
| of which ZnI | 0% | 15% | Typical values |
| others | 0% | 5% | Typical values |

Figure 2:
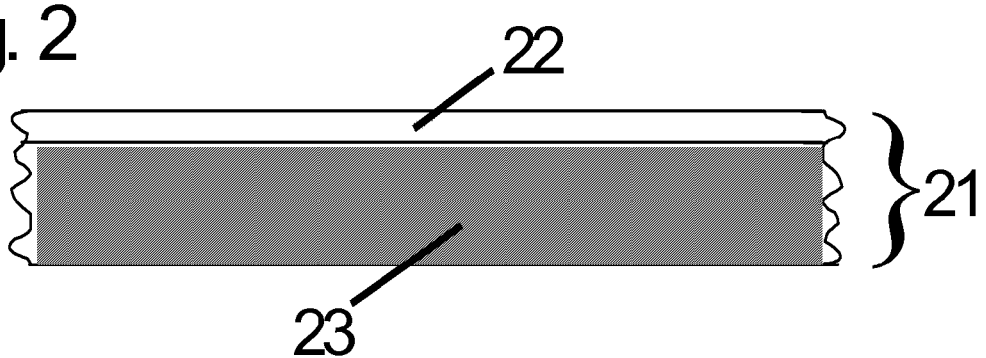
FIG. 2 shows a diffusion barrier layer as a coating on the inner surface of a quartz bulb substrate of a discharge vessel.
Figure 3:
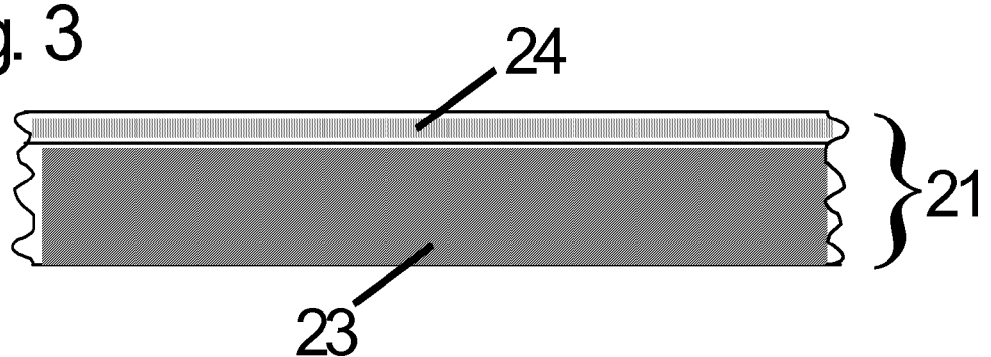
FIG. 3 shows a diffusion barrier layer as a zone of the inner surface of a quartz bulb substrate of a discharge vessel.
Figure 4:
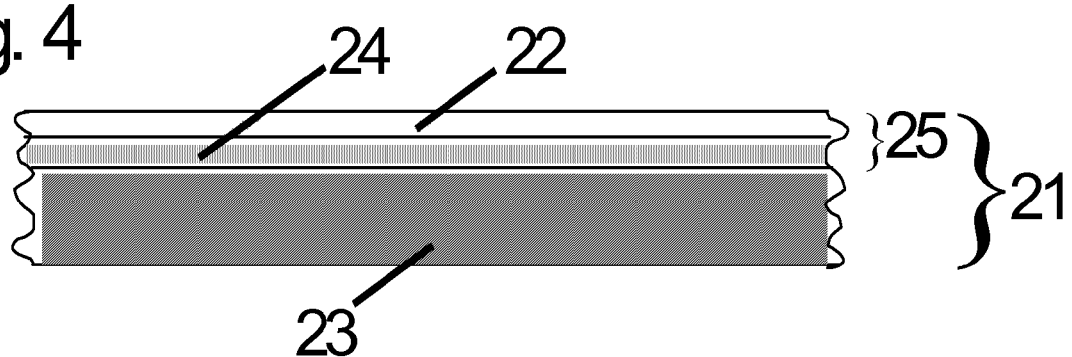
FIG. 4 shows a diffusion barrier layer as a coating on the inner surface of a quartz bulb substrate of a discharge vessel in combination with a diffusion barrier layer as a zone of the inner surface of a quartz bulb substrate.

FIGS. 2 to 4 respectively show an enlarged detail of the wall of the discharge vessel, for instance the quartz glass discharge vessel 2. In this case, the diffusion layers 22 and 24 respectively face in the direction of the discharge space.

FIG. 2 shows a diffusion barrier layer 22 as a coating on the inner surface of the quartz glass substrate 21 of a discharge vessel. The coating has been applied as a microcrystalline and/or sub-microcrystalline $SiO_2$ layer by means of a PICVD method on the vitreous $SiO_2$ 23 of the quartz glass substrate 21.

FIG. 3 shows a diffusion barrier layer 24 as a zone of the inner surface of the quartz bulb substrate 21 of the discharge vessel. This likewise microcrystalline and/or sub-microcrystalline $SiO_2$ layer has been generated by crystallization of the inner surface zone of the quartz glass substrate 21 of the discharge vessel by means of heat input by plasma discharges. Immediately adjoining and meshed with this diffusion barrier layer 24 lies the rear vitreous zone 23 of the quartz glass substrate.

FIG. 4 shows a combination of the two diffusion barrier layers corresponding to FIGS. 2 and 3. First, a diffusion barrier layer 24 has been generated as a zone of the inner surface of the quartz bulb substrate 21 by crystallization of the inner surface zone of the quartz glass substrate 21 of the discharge vessel by means of heat input by plasma discharges. Subsequently thereto, a further diffusion barrier layer 22 has been applied as a coating by means of a PICVD method onto the inner surface of the quartz bulb substrate 21 configured as a diffusion barrier layer 24. Owing to the interaction of the atoms, the two microcrystalline and/or sub-microcrystalline $SiO_2$ layers exhibit good adhesion with one another. The exemplary embodiments described above may also be used correspondingly for other lamp types and other substrate materials. Also envisaged here, in particular, are vessels of halogen lamps which, besides quartz glass, may alternatively or additionally be made of other materials such as hard glasses or ceramic.

It is clear to the person skilled in the art that the invention is not restricted to the exemplary embodiments as described above, rather it may be modified in a wide variety of ways. In particular, the exemplary embodiments may also be combined with one another.

The invention claimed is:

1. A method for producing a lamp vessel of quartz glass for discharge lamps with a diffusion barrier inner layer, the method comprising:
    applying a microcrystalline diffusion barrier inner layer (22) as a single layer, which consists of silicon dioxide, the microcrystalline diffusion barrier inner layer (22) being applied by a CVD method on the inner wall of the lamp vessel.

2. A method for producing a lamp vessel of transparent material for discharge lamps with a diffusion barrier inner layer, the method comprising:
    generating a microcrystalline diffusion barrier inner layer (24) in the interfacial zone of a substrate forming the vessel to the vessel's interior by means of heat treatment of the lamp vessel inner surface; and
    subsequently applying a further diffusion barrier inner layer (22) by a CVD method on the inner wall of the lamp vessel.

3. The method for producing a lamp vessel as claimed in claim 2, wherein the further diffusion barrier inner layer (22) is applied by a reactive coating method, selected from the group:
    PICVD (Plasma-Impulse-Chemical-Vapor-Deposition)
    PECVD (Plasma-Enhanced-Chemical-Vapor-Deposition)
    PACVD (Plasma-Assisted-Chemical-Vapor-Deposition)
    TCVD (Thermal-Chemical-Vapor-Deposition).

4. A method for producing a lamp vessel of quartz glass for discharge lamps with a diffusion barrier inner layer, the method comprising:
    generating a microcrystalline diffusion barrier inner layer (24) in the interfacial zone of a quartz glass substrate forming the vessel to the vessel's interior by means of heat treatment of the vessel inner surface.

5. The method for producing a lamp vessel as claimed in claim 4, wherein a diffusion barrier inner layer (24) is generated by means of heat input by a plasma discharge on the vessel inner surface.

6. The method for producing a lamp vessel as claimed in claim 5, wherein a diffusion barrier inner layer (24) is generated by means of heat treatment of the surface by a plasma treatment by means of a reactive gas on the vessel inner surface.

7. The method for producing a lamp vessel as claimed in claim 6, wherein the heat treatment of the surface is generated by a plasma treatment by means of a reactive etching gas on the discharge vessel inner surface, and wherein the reactive etching gas is oxygen or sulfur hexafluoride.

8. The method for producing a lamp vessel as claimed in claim 4, wherein the two diffusion barrier inner layers (22) and (24) are generated in successive process steps on the same apparatus.

9. The method as claimed in claim 4, wherein a discharge vessel for gas discharge lamps is provided with a diffusion barrier layer.

10. The method as claimed in claim 4, wherein a lamp vessel of an incandescent lamp is provided with a diffusion barrier layer.

11. The method as claimed in claim 4, wherein a lamp vessel of quartz glass is provided with a diffusion barrier layer.

12. A lamp vessel of quartz glass with a diffusion barrier inner layer, produced in accordance with the method of claim 1, wherein a diffusion barrier inner layer (24) is applied, which is a single layer and consists of microcrystalline silicon dioxide.

13. The lamp vessel as claimed in claim 12, wherein the crystallite size of the silicon dioxide of a diffusion barrier inner layer is less than 50 nm.

14. The lamp vessel as claimed in claim 12, wherein the layer thickness of a diffusion barrier inner layer is from 10 to 2000 nm.

15. The lamp vessel as claimed in claim 12, wherein a diffusion barrier inner layer (22) is applied as a coating on the inner surface of the vessel interior.

16. The lamp vessel as claimed in claim 12, wherein a diffusion barrier inner layer (24) is that zone of the quartz glass substrate of the vessel interior which adjoins the vessel interior.

17. The lamp vessel as claimed in claim 12, wherein a diffusion barrier inner layer (25) is a combination of that zone of the quartz glass substrate of the vessel which adjoins the discharge space as a diffusion barrier layer (24) and a coating of silicon dioxide on the inner surface of the vessel as a further diffusion barrier layer (22).

18. The lamp vessel as claimed in claim 12, wherein the diffusion barrier inner layer forms a diffusion barrier against sodium and/or scandium and/or zinc.

19. An incandescent lamp comprising a lamp vessel as claimed in claim 12.

20. The lamp vessel as claimed in claim 12, wherein the lamp vessel contains sodium.

21. The lamp vessel as claimed in claim 12, wherein the lamp vessel contains iodine or bromine.

22. A metal halide lamp comprising a lamp vessel as claimed in claim 12.

23. A high-pressure lamp or ultrahigh-pressure lamp comprising a vessel as claimed in claim 12.

24. An illumination instrument in the automotive field comprising a lamp vessel as claimed in claim 12.

* * * * *